(12) United States Patent
Okita

(10) Patent No.: US 9,521,492 B2
(45) Date of Patent: *Dec. 13, 2016

(54) CONDENSER MICROPHONE

(71) Applicant: KABUSHIKI KAISHA AUDIO-TECHNICA, Machida-shi, Tokyo (JP)

(72) Inventor: Shioto Okita, Machida (JP)

(73) Assignee: KABUSHIKI KAISHA AUDIO-TECHNICA, Machida-Shi, Tokyo (JP)

( * ) Notice: Subject to any disclaimer, the term of this patent is extended or adjusted under 35 U.S.C. 154(b) by 35 days.

This patent is subject to a terminal disclaimer.

(21) Appl. No.: 14/699,545

(22) Filed: Apr. 29, 2015

(65) Prior Publication Data
US 2015/0326962 A1 Nov. 12, 2015

(30) Foreign Application Priority Data

May 12, 2014 (JP) ................. 2014-098702

(51) Int. Cl.
H04R 25/00 (2006.01)
H04R 3/00 (2006.01)
H04R 19/01 (2006.01)
H04R 1/08 (2006.01)
H03F 3/185 (2006.01)
H03F 3/50 (2006.01)

(52) U.S. Cl.
CPC ............ H04R 19/016 (2013.01); H03F 3/185 (2013.01); H03F 3/505 (2013.01); H04R 1/08 (2013.01); H04R 3/00 (2013.01)

(58) Field of Classification Search
CPC ... H04R 19/04; H04R 2201/003; H04R 1/406; H04R 3/00; H04R 3/005; H04R 17/02; H04R 19/016; H04R 1/04; H04R 1/326; H04R 1/222; H04R 29/004; H04R 1/342; H04R 2201/403; H04R 25/405; H04R 3/007; G10L 2021/02166; G10L 2021/02165; H04S 2400/15; G10K 11/02; G10K 11/1784
USPC ............ 381/174, 113, 92, 122, 91, 111, 355, 369,381/26

See application file for complete search history.

(56) References Cited

U.S. PATENT DOCUMENTS

2012/0114146 A1* 5/2012 Shimura ............. H04R 19/016 381/174
2012/0269367 A1* 10/2012 Akino ................. H04R 29/006 381/174

FOREIGN PATENT DOCUMENTS

JP 5201598 B2 6/2013

* cited by examiner

Primary Examiner — Paul S Kim
Assistant Examiner — Norman Yu
(74) Attorney, Agent, or Firm — Manabu Kanesaka

(57) ABSTRACT

Provided is a condenser microphone having a plurality of condenser microphone units connected in series to improve output sensitivity, and a simplified circuit configuration. At least one of the preceding condenser microphone units, excepting a last condenser microphone unit, and an adjacent succeeding condenser microphone unit are directly connected to transmit an audio signal obtained from the at least one of the preceding condenser microphone units to the adjacent succeeding condenser microphone unit. An impedance converter using an active element is connected to the last condenser microphone unit, and the audio signals obtained from the condenser microphone units are added and output from the impedance converter using the active element.

4 Claims, 5 Drawing Sheets

CONDENSER MICROPHONE

RELATED APPLICATIONS

The present application is based on, and claims priority from, Japanese Application No. JP2014-098702 filed May 12, 2014, the disclosure of which is hereby incorporated by reference herein in its entirety.

BACKGROUND OF THE INVENTION

Field of the Invention

The present invention relates to a condenser microphone having a plurality of condenser microphone units connected in series to improve output sensitivity.

Description of the Related Art

A condenser microphone generates an audio signal based on a change in capacitance between a diaphragm and a fixed electrode which are opposed to each other.

In this configuration, a condenser microphone unit is disposed with the diaphragm opposing to the fixed electrode, and the condenser microphone unit has a capacitance of approximately several ten picofarads, and an output impedance is considerably high. Therefore, the audio signal is extracted using an impedance converter using for example a field effect transistor (FET).

Various devices for improving the output sensitivity of the condenser microphone have been proposed conventionally, a condenser microphone using a plurality of condenser microphone units connected in series to improve output sensitivity has been proposed by an applicant of the present invention, and disclosed in JP 5201598 B2.

FIG. 4 is a block diagram illustrating a configuration of a condenser microphone disclosed in JP 5201598 B2. In the configuration illustrated in FIG. 4, the condenser microphone unit is formed that the diaphragm is opposed to the fixed electrode, and audio signals obtained from first and second condenser microphone units U1 and U2 are added in series in the same phase.

That is, the diaphragm $1a$ of the first condenser microphone unit U1 is grounded, and the fixed electrode $2a$ opposed to the diaphragm $1a$ is connected to the first impedance converter $3a$. Therefore, the audio signal is generated by the impedance converter $3a$ based on a change in capacitance between the diaphragm $1a$ and the fixed electrode $2a$ of the condenser microphone unit U1.

As described below, the impedance converter $3a$ constitutes a source follower circuit using an active element such as the FET, and an operation current is supplied from a DC power supply Vcc to the impedance converter $3a$.

The first impedance converter $3a$ generates the audio signal of a first condenser microphone unit U1, and the audio signal is configured to drive a reference potential point of the second condenser microphone unit U2. That is, in an example illustrated in FIG. 4, output from the first impedance converter $3a$ is supplied to the diaphragm $1b$ constituting the second condenser microphone unit U2.

The fixed electrode $2b$ opposed to the diaphragm $1b$ is connected to the second impedance converter $3b$, and the audio signal is generated by the impedance converter $3b$ based on a change in capacitance between the diaphragm $1b$ and the fixed electrode $2b$ of the condenser microphone unit U2.

In this configuration, in the second condenser microphone unit U2, the audio signal obtained from the first condenser microphone unit U1 is applied to the reference potential point (diaphragm $1b$) of the first condenser microphone unit U1. Accordingly, the audio signals obtained from the first and second condenser microphone units U1 and U2 are added in series in the same phase, are output from an output terminal Out of the second impedance converter $3b$.

It is noted that also in the second impedance converter $3b$, the source follower circuit is constituted for example using the FET, similar to the first impedance converter $3a$.

According to a configuration of the condenser microphone illustrated in FIG. 4, the audio signals obtained from the first and second condenser microphone units U1 and U2 are added in phase, and a resultant signal is output. Therefore, the output sensitivity as the condenser microphone can be doubled.

In addition to the example illustrated in FIG. 4, FIG. 5 represents an example of a condenser microphone including a third condenser microphone unit U3, and the third condenser microphone unit U3 includes a third impedance converter $3c$ similar to the impedance converters having been described above.

According to a configuration illustrated in FIG. 5, audio signals obtained from the first to third condenser microphone units U1 to U3 are added in phase and a resultant signal is output. Therefore, the output sensitivity as the condenser microphone can be further increased.

In the condenser microphone disclosed in JP 5201598 B2, the impedance converters need to be provided corresponding to the plurality of condenser microphone units connected in series, respectively, as described above.

Each of the impedance converters employs the active element such as FET. Therefore, each of the impedance converters requires a circuit configuration for driving the active element, and further requires a configuration for supplying operation power (DC power supply Vcc) for the active element. Therefore, disadvantageously, the whole circuit structure of the condenser microphone is complicated, and inevitably results in a high cost.

Further, the operation power supply uses a limited power supply such as a known phantom power supply or a battery, and when a plurality of impedance converters using active elements such as an FET is used, each of the impedance converters requires a drive current. As a result, even if for example the phantom power supply is used, the condenser microphone has such a problem that a drop in voltage of the operation power supply for the impedance converter is increased, a maximum output level of the condenser microphone is also limited, and it is difficult to increase a dynamic range.

The present invention has been made in view of the above-mentioned problems of a conventional condenser microphone including the impedance converter using the active element for each of the condenser microphone units, as described above, and it was found that preceding condenser microphone units are directly connected, excepting an impedance converter connected to a last condenser microphone unit, so that an audio signal obtained from a preceding condenser microphone unit is added to an audio signal obtained from a succeeding condenser microphone unit and transmitted.

SUMMARY OF THE INVENTION

A condenser microphone according to an embodiment of the present invention has been made in view of the above-mentioned findings, and uses the function that when preceding condenser microphone units are directly connected, excepting a last condenser microphone unit, an audio signal obtained from each of the condenser microphone units is added to an audio signal obtained from a succeeding condenser microphone unit and transmitted.

Therefore, it is intended to provide the condenser microphone having an improved output sensitivity, and a circuit configuration simplified as a whole.

The condenser microphone according to an embodiment of the present invention has been made to improve the above-mentioned problems. The condenser microphone includes a plurality of condenser microphone units each including a fixed electrode and a diaphragm disposed to oppose the fixed electrode; and an impedance converter, wherein the condenser microphone units are connected in series to be added in phase and output audio signals obtained from the condenser microphone units. In the condenser microphone, at least one of the preceding condenser microphone units, excepting a last condenser microphone unit, and an adjacent succeeding condenser microphone unit are directly connected to each other to transmit an audio signal obtained from the at least one of the preceding condenser microphone units to the adjacent succeeding condenser microphone unit, the impedance converter using an active element is connected to the last condenser microphone unit, and the audio signals obtained from the condenser microphone units are added and output from the impedance converter using the active element.

In this configuration, each of the condenser microphone units preferably employs an electret condenser microphone unit including a dielectric electret film on any one of the fixed electrode or the diaphragm.

In a preferable form of the present invention, a diaphragm of a first condenser microphone unit in the plurality of condenser microphone units is grounded and a fixed electrode opposed to the diaphragm is directly connected to a diaphragm of a second condenser microphone unit in the plurality of condenser microphone units, and when the second condenser microphone unit is the last condenser microphone unit, the impedance converter is connected to a fixed electrode of the last condenser microphone unit.

In addition, the diaphragms of the plurality of condenser microphone units are preferably disposed on the same plane.

With the condenser microphone according to an embodiment of the present invention, a preceding condenser microphone unit excepting the last condenser microphone unit, is directly connected to the adjacent succeeding condenser microphone unit, and the audio signal obtained from the preceding condenser microphone unit can be transmitted to the adjacent succeeding condenser microphone unit.

Therefore, the audio signals obtained from the condenser microphone units are added in phase, and the audio signals added can be obtained from the impedance converter connected to the last condenser microphone unit.

Therefore, a condenser microphone can be provided which has a circuit configuration simplified as a whole, compared with the conventional condenser microphone including the impedance converter using the active element for each of the condenser microphone units.

DESCRIPTION OF THE PREFERRED EMBODIMENTS

A condenser microphone according to an embodiment of the present invention will be described below with reference to the drawings.

Figure 1:
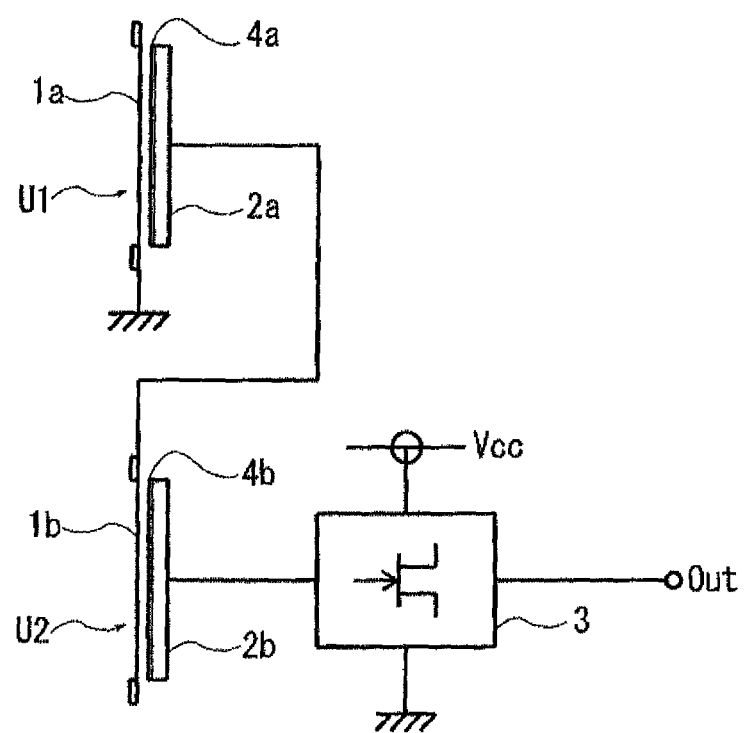
FIG. 1 is a block diagram illustrating a condenser microphone according to a first embodiment of the present invention.

FIG. 1 is a block diagram illustrating an example of a condenser microphone according to a first embodiment, using two condenser microphone units U1 and U2.

The condenser microphone units U1 and U2 illustrated in FIG. 1 include diaphragms 1a and 1b, respectively, and the diaphragms are disposed on the same plane.

Further, fixed electrodes 2a and 2b have surfaces opposed to the diaphragms, respectively, and the surfaces are of a back electret type including dielectric electret films 4a and 4b, respectively.

It is noted that, even if a film electret including the dielectric electret film on the diaphragm side is employed, the same effect as described below is obtained.

As illustrated in FIG. 1, the diaphragm 1a of a first condenser microphone unit U1 is grounded, and the fixed electrode 2a opposed to the diaphragm 1a is directly connected to the diaphragm 1b of a second condenser microphone unit U2.

In the present embodiment, an impedance converter 3 using an FET is connected to the fixed electrode 2b of a last second condenser microphone unit U2, and the impedance converter 3 has an output terminal Out from which audio signals obtained from the first and second condenser microphone units U1 and U2, added in series in the same phase, are output.

Figure 4:
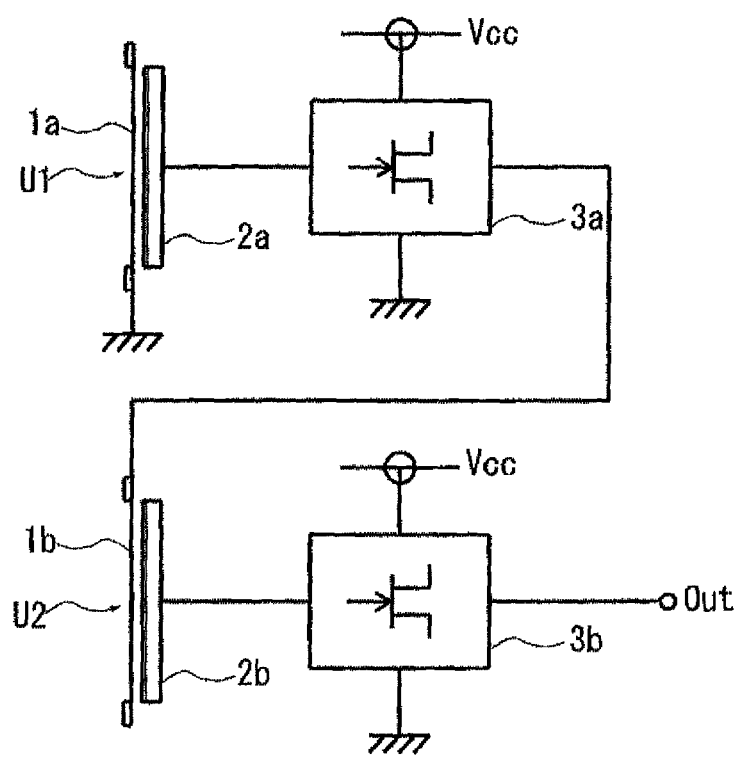
FIG. 4 is a block diagram illustrating one example of a conventional condenser microphone.
Figure 5:
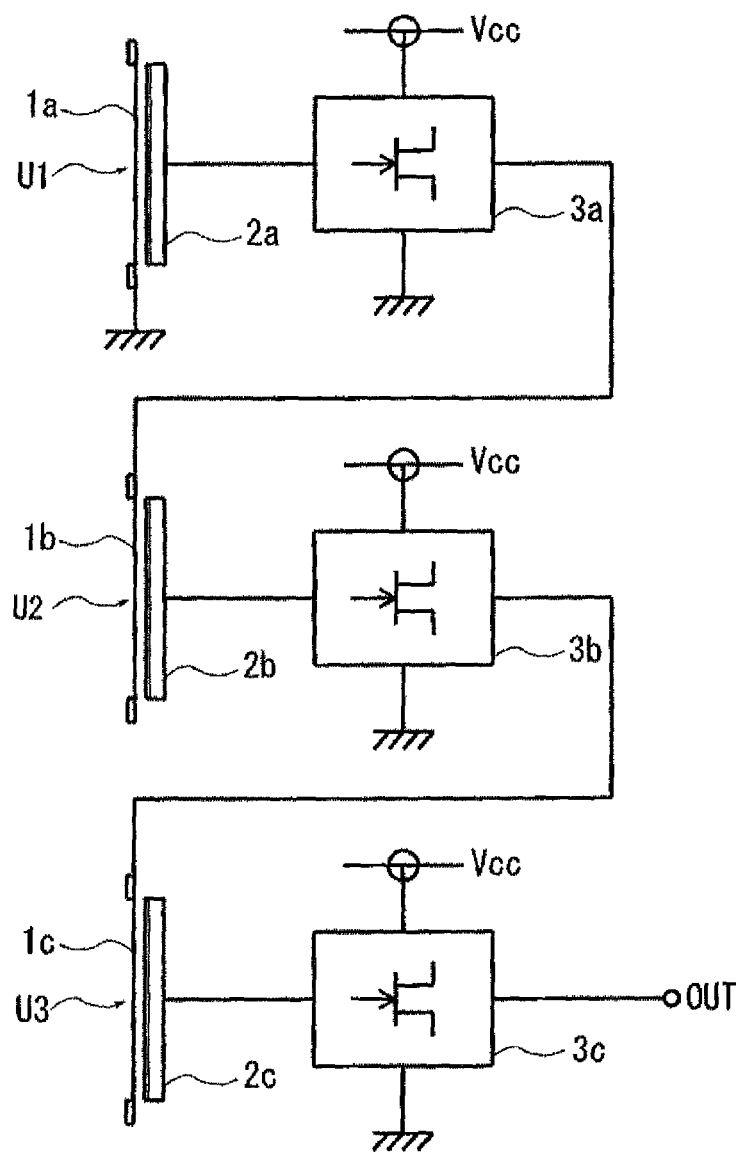
FIG. 5 is a block diagram illustrating another example of a conventional condenser microphone.

That is, in the embodiment of FIG. 1, the impedance converter 3a between the first and second condenser microphone units U1 and U2 are eliminated, as compared with a conventional example of FIG. 4 having been described, and the first and second condenser microphone units U1 and U2 are directly connected.

The audio signals obtained from the condenser microphone units are allowed to be extracted while being added in series in the same phase, without a special impedance converter between the condenser microphone units connected in series, and this configuration was tested by the inventor.

The impedance converter 3 is connected to the fixed electrode 2b of the last second condenser microphone unit U2, and the impedance converter 3 is required for matching with an external circuit upon connection with the external circuit.

It is noted that in a configuration illustrated in FIG. 1, a space between the diaphragm 1a and the fixed electrode 2a of the preceding condenser microphone unit U1 can be considered as a condenser element having a voltage between terminals changing according to an audio waveform. Further, similarly, a space between the diaphragm 1b and the fixed electrode 2b of the succeeding condenser microphone unit U2 can also be considered as the condenser element having a voltage between terminals changing according to an audio waveform.

It is believed that because the condenser elements are connected in series, the audio signals obtained from the first and second condenser microphone units U1 and U2 are added in series in the same phase, and output from the impedance converter 3.

Figure 2:
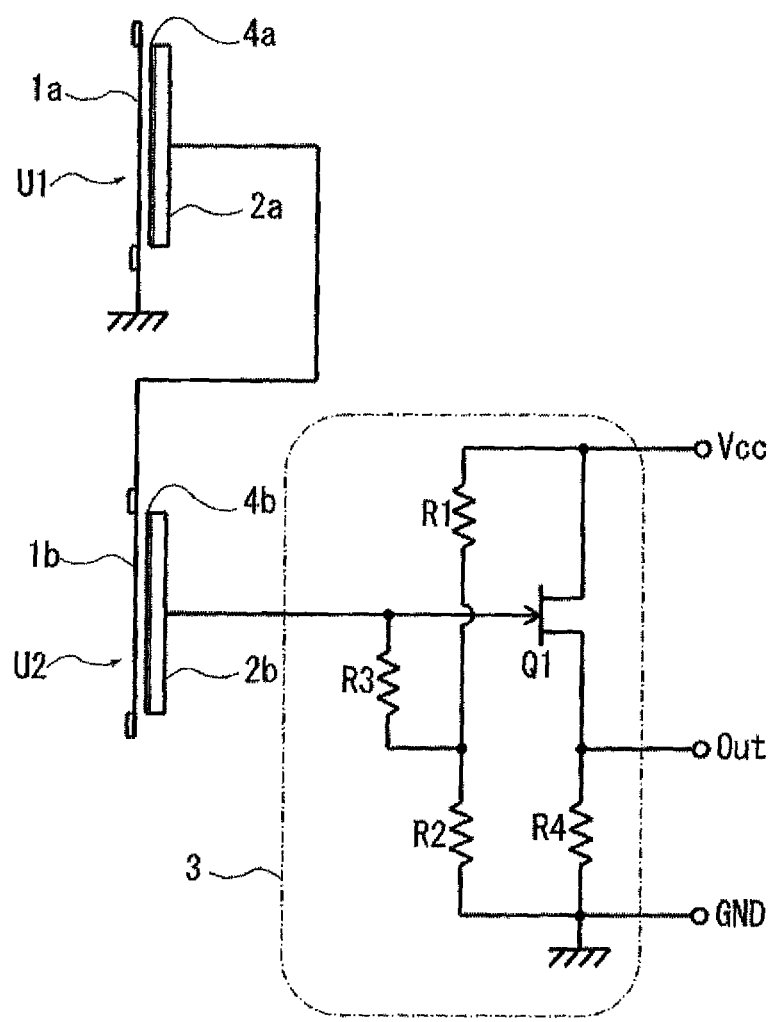
FIG. 2 is a diagram illustrating a specific example of a circuit according to the first embodiment of FIG. 1.

FIG. 2 is a diagram illustrating a specific example of a circuit according to the first embodiment of FIG. 1, and particularly, FIG. 2 illustrates one specific example of the impedance converter 3.

The impedance converter 3 is mounted with an re-channel FET denoted by reference sign Q1 which functions as an active element, and the FET Q1 has a gate electrode to which the fixed electrode 2b of the second condenser microphone unit U2 is connected.

Voltage dividing resistors R1 and R2 are connected between a DC power supply Vcc and a grounding point GND, a bias resistor R3 is connected between a connection point between the voltage dividing resistors and the gate electrode, and a predetermined bias voltage is supplied to the gate electrode.

Further power is supplied from the DC power supply Vcc to a drain electrode of the FET Q1, a resistive element R4 is connected between a source electrode of the FET Q1 and the grounding point GND, and the source electrode of the FET Q1 is defined as an output terminal Out. That is, the impedance converter 3 illustrated in FIG. 2 constitutes a known source follower circuit.

Figure 3:
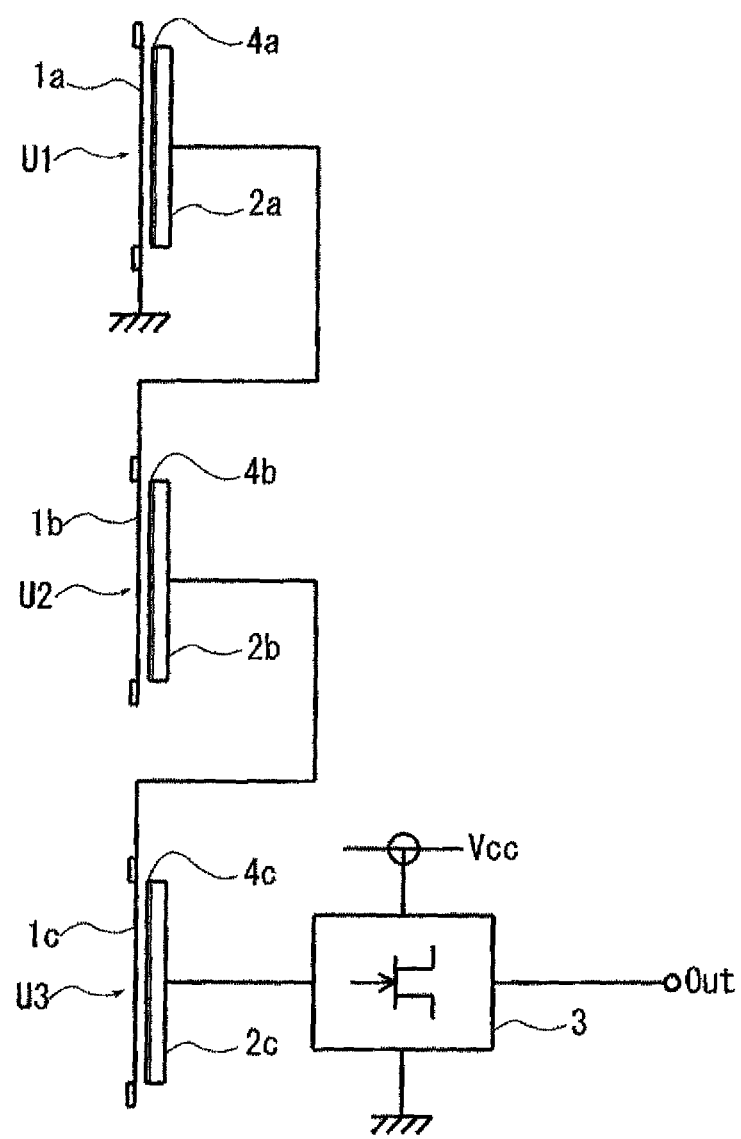
FIG. 3 is a block diagram illustrating a condenser microphone according to a second embodiment of the present invention.

It is noted that the impedance converter 3 has a configuration illustrated in FIG. 2, and the configuration can be employed as the impedance converter 3 illustrated in FIG. 3.

FIG. 3 is a block diagram illustrating the condenser microphone according to a second embodiment, and illustrates an example of the condenser microphone using three condenser microphone units U1 to U3, and respective diaphragms 1a to 1c of the condenser microphone units U1 to U3 are disposed on the same plane. The fixed electrodes 2a to 2c have surfaces opposed to the diaphragms, respectively, and employing a back electret including the dielectric electret films 4a to 4c, respectively.

In the example of the condenser microphone illustrated in FIG. 3, the diaphragm 1a of the first condenser microphone unit U1 is grounded, and the fixed electrode 2a opposed to the diaphragm 1a is directly connected to the diaphragm 1b of the second condenser microphone unit U2.

Further, the fixed electrode 2b of the second condenser microphone unit U2 is directly connected to the diaphragm 1c of a last third condenser microphone unit U3 in the present embodiment.

The impedance converter 3 using the FET is connected to the fixed electrode 2c of the third condenser microphone unit U3, and the audio signals obtained from the first to third condenser microphone units U1 to U3 are added in series in the same phase, and output from the output terminal Out of the impedance converter 3.

Even in the example of the condenser microphone illustrated in FIG. 3, similarly to the example as illustrated in FIG. 2, spaces between the diaphragms 1a to 1c and the fixed electrodes 2a to 2c of the condenser microphone units U1 to U3 can be considered as the condenser elements having a voltage between terminals changing according to an audio waveform.

Accordingly, three condenser elements having a voltage between terminals changing according to an audio waveform are connected in series, the audio signals obtained from the first to third condenser microphone units U1 to U3 are added in series in the same phase, and output from the impedance converter 3 connected to the last third condenser microphone unit U3.

As is apparent from the above description, the condenser microphone according to an embodiment of the present invention provides a condenser microphone having a circuit configuration simplified as a whole, compared with the conventional condenser microphone including the impedance converter using the active element such as the FET, for each of the condenser microphone units.

Therefore, the present invention overcomes the problems of the conventional condenser microphone, which has described in Description of the Related Art, and effectively functions as described in SUMMARY OF THE INVENTION.

What is claimed is:

1. A condenser microphone comprising:
   a plurality of condenser microphone units each including a fixed electrode and a diaphragm disposed to oppose the fixed electrode; and
   an impedance converter, wherein
   the condenser microphone units are connected in series to be added in phase and output audio signals obtained from the condenser microphone units,
   at least one of the preceding condenser microphone units, excepting a last condenser microphone unit, and an adjacent succeeding condenser microphone unit are directly connected to each other to transmit an audio signal obtained from the at least one of the preceding condenser microphone units to the adjacent succeeding condenser microphone unit,
   the impedance converter using an active element is connected to the last condenser microphone unit, and
   the audio signals obtained from the condenser microphone units are added and output from the impedance converter using the active element.

2. The condenser microphone according to claim 1, wherein each of the condenser microphone units is an electret condenser microphone unit including a dielectric electret film on any one of the fixed electrode or the diaphragm.

3. The condenser microphone according to claim 1, wherein a diaphragm of a first condenser microphone unit in the plurality of condenser microphone units is grounded and a fixed electrode opposed to the diaphragm of the first condenser microphone unit is directly connected to a diaphragm of a second condenser microphone unit in the plurality of condenser microphone units, and when the second condenser microphone unit is the last condenser microphone unit, the impedance converter is connected to a fixed electrode of the last condenser microphone unit.

4. The condenser microphone according to claim 1, wherein the diaphragms of the plurality of condenser microphone units are disposed on the same plane.

* * * * *